United States Patent [19]

Hsu

[11] Patent Number: 4,660,276

[45] Date of Patent: Apr. 28, 1987

[54] METHOD OF MAKING A MOS FIELD EFFECT TRANSISTOR IN AN INTEGRATED CIRCUIT

[75] Inventor: Sheng T. Hsu, West Windsor Township, Mercer County, N.J.

[73] Assignee: RCA Corporation, Princeton, N.J.

[21] Appl. No.: 764,551

[22] Filed: Aug. 12, 1985

[51] Int. Cl.$^4$ .......................................... H01L 21/283
[52] U.S. Cl. ...................................... 29/571; 29/590; 29/578; 148/DIG. 147; 427/88
[58] Field of Search .......................... 29/571, 590, 578; 427/88, 93; 357/23; 148/DIG. 147

[56] References Cited

U.S. PATENT DOCUMENTS

| | | | |
|---|---|---|---|
| 3,777,364 | 12/1973 | Schinella et al. | 29/578 |
| 4,128,670 | 12/1978 | Gaensslen | 427/86 |
| 4,227,944 | 10/1980 | Brown et al. | 148/6 |
| 4,285,761 | 8/1981 | Fatula, Jr. et al. | 156/628 |
| 4,330,931 | 5/1982 | Liu | 29/571 |
| 4,356,040 | 10/1982 | Fu et al. | 148/1.5 |
| 4,378,628 | 4/1983 | Levinstein et al. | 29/571 |
| 4,384,301 | 5/1983 | Tasch et al. | 357/23 |
| 4,389,257 | 6/1983 | Geipel, Jr. et al. | 148/1.5 |
| 4,398,341 | 8/1983 | Geipel, Jr. et al. | 29/578 |
| 4,441,247 | 4/1984 | Gargini et al. | 29/571 |
| 4,501,769 | 2/1985 | Hieber et al. | 427/95 |
| 4,503,601 | 3/1985 | Chiao | 29/571 |
| 4,510,670 | 4/1985 | Schwabe et al. | 29/571 |
| 4,521,952 | 6/1985 | Riseman | 29/590 |
| 4,587,710 | 5/1986 | Tsao | 29/571 |

OTHER PUBLICATIONS

Shibata et al., "An Optimally Designed Process for Submicron MOSFETS" IEEE IEDM 1981, pp. 647-650.
Jones et al., "Salicide with Buried Silicide Layer", IBM Tech. Discl. Bul., vol. 27, No. 2, Jul. 1984, pp. 1044-1045.
Iyer et al., "New Salicide Spacer Technology", IBM Tech. Disclosure Bulletin, vol. 27, No. 3, Aug. 1984, pp. 1801-1802.
Alperin et al., "Development of Self-Aligned Titanium Silicide Process for VLSI", IEEE Trans. Elec. Devices, ED-32(2), 2/1985, pp. 141-150.
Baglin et al., "Fabrication of Conductive Refractory Silicides" IBM Tech. Disc. Bulletin, vol. 20, No. 10, 3/1978, p. 4189.
Metz et al., "Electrical Properties of Selectively Deposited Tungsten from Films", Appl. Phys. Lett 44(12), Jun. 15, 1984, pp. 1139-1141.
Broadbent, E. K. et al., "Selective Low Pressure Chemical Vapor Deposition of Tungsten" in J. Electrochem. Soc.: Solid-State Science and Technology, Jun. 1984, pp. 1427-1433.
Stacy, W. T., et al., "Interfacial Structure of Tungsten Layers Formed by Selective Low Pressure Chemical Vapor Deposition" in J. Electrochem. Soc.: Solid-State Science and Technology, Feb. 1985, pp. 444-448.
"Ohmic Contacts for Small, Shallow Structure Devices" KU, IBM TDB, vol. 22, No. 4, Sep. 1979, 1487-8.

Primary Examiner—Brian E. Hearn
Assistant Examiner—T. N. Quach
Attorney, Agent, or Firm—Joseph S. Tripoli; Donald S. Cohen; James M. Trygg

[57] ABSTRACT

A method for making a MOS field effect transistor structure having tungsten silicide contact surfaces for the gate and source and drain regions is disclosed. Protective oxide is very precisely positioned so that a tungsten layer is formed on only selected silicon surfaces by selective deposition. Next, a layer of polysilicon is formed on said tungsten layer. The resulting structure is treated in an oxygen atmosphere to form the desired tungsten silicide. A silicon nitride cap can also be used to cover the gate portion during source and drain formation.

5 Claims, 8 Drawing Figures

METHOD OF MAKING A MOS FIELD EFFECT TRANSISTOR IN AN INTEGRATED CIRCUIT

This invention relates to MOS field effect transistors formed in a semiconducting body of an integrated circuit device, and more particularly, to such transistors having metal silicide regions in the source, drain, and gate.

BACKGROUND OF THE INVENTION

There is a continuous effort in the semiconductor industry directed toward increasing device density by scaling down the feature sizes of the MOS transistors which are formed in the device. When such scaling occurs, the depths of the source and drain regions must be reduced proportionally. This, however, increases the resistivity of those N+ and P+ diffusion regions thereby decreasing the speed of the MOS integrated circuit. Further, very shallow source and drain regions are susceptible to metal spike through from the metallization at the contact areas of the N+ and P+ regions.

One structure for overcoming some of these problems is disclosed in U.S. Pat. No. 4,384,301 which issued May 17, 1983 to Tasch, Jr. et al. Tasch discloses an MOS field effect transistor for an integrated circuit having metal silicide regions in the source, drain, and gate where ohmic contact is made with the integrated circuit metallization. Metal silicide effectively reduces the incidence of metal spike through into the source and drain regions by preventing aluminum diffusion through the silicide. When forming metal silicide contact areas on the source and drain regions, one must be certain to prevent the metal silicide from extending to the gate thereby shorting the transistor. Tasch accomplishes this by depositing a layer of silicon dioxide over the entire device, subjecting the layer to an argon implant which is perpendicular to the surface of the device, then, using a hydrofluoric acid etch, removing the implanted areas of the deposited oxide layer. This leaves a layer of silicon oxide only on the vertical sidewalls of the gate. When the metal silicide is formed on the source and drain regions, the oxide on the sidewalls of the gate prevents contact between the gate and the metal silicide. With this process, however, the argon implant represents an extra processing step that is not easily incorporated into existing wafer fabrication lines.

Tasch forms the metal silicide in a three step process beginning with sputtering platinum on the entire surface of the wafer. The wafer is then annealed to form platinum silicide areas on the source and drain regions. Platinum which was not converted to platinum silicide is then selectively removed by means of an aqua regia etch. Here again, an extra processing step is introduced by the necessity of etching away unwanted platinum.

These extra steps, which add complexity to the manufacturing process, necessarily increase the cost of manufacturing and ultimately can affect yield. What is desired is a manufacturing process for making integrated circuit devices having MOS field effect transistors with metal silicide contact areas on the source, drain, and gate, which is both efficient and reliable.

SUMMARY OF THE INVENTION

According to the present invention there is disclosed a method of making an MOS field effect transistor in a semiconducting body of an integrated circuit device. The body has a surface and a layer of gate oxide disposed on the surface. The method comprises the following steps. Forming an undoped silicon gate on the layer of oxide wherein the gate has a top surface and a pair of sidewalls. Forming a source region in the body adjacent one of the sidewalls and a drain region in the body adjacent the other of the sidewalls while only lightly doping the gate. Forming a layer of silicon oxide on the gate including the sidewalls. Removing a portion of the layer of silicon oxide using an anisotropic plasma etch leaving the silicon oxide on only the sidewalls of the gate thereby leaving an exposed silicon surface on each of the source and drain regions and the gate. Forming a layer of refractory metal on only the exposed surfaces. Forming a layer of polysilicon on the layer of refractory metal. Heating the layer of refractory metal and the body in an oxygen atmosphere thereby forming metal silicide at each of the exposed surfaces.

DESCRIPTION OF THE PREFERRED EMBODIMENT

Figure 1:
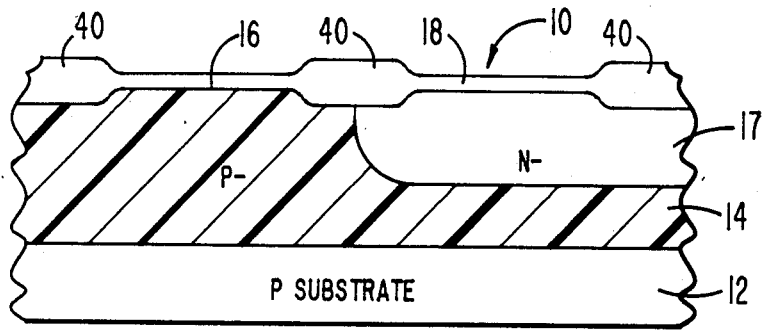
FIGS. 1 through 8 are schematic representations of cross-sectional views of a portion of an integrated circuit device showing various steps of manufacture of an MOS field effect transistor utilizing the teachings of the present invention.

There is shown in FIG. 1 a portion of an integrated circuit device 10 including a substrate 12 of a first conductivity type material, which is lightly doped P type in the present example. An epitaxial layer 14 of first conductivity type material, which is lightly doped P type is disposed over the substrate 12. The layer 14 includes a planar surface 16 on a side opposite that of the substrate 12. The layer 14 includes a well region 17 of second conductivity type, which is lightly doped N type having a resistivity of from about 1.0 to 2.0 ohms cm. Isolation oxide 40 is grown in the usual manner and is arranged to electrically isolate the various components of the integrated circuit. A relatively thin layer 18 of gate oxide is disposed on the surface 16 as shown in FIG. 1. The specific materials and processing techniques utilized to obtain the device 10 as depicted in FIG. 1, are well known in the art. Any suitable one of the several well known procedures in use today may be advantageously employed.

Figure 2:
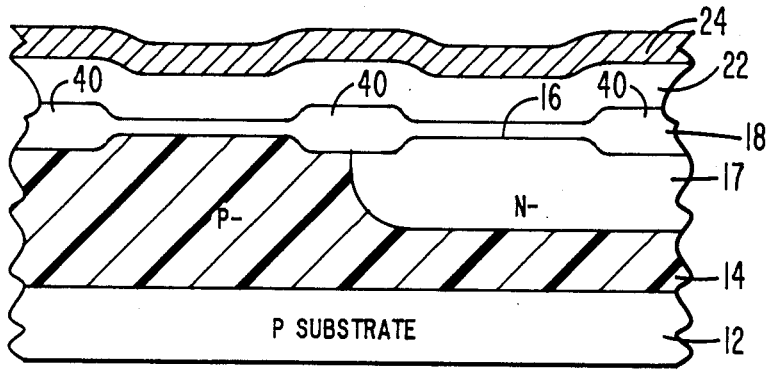
Figure 3:
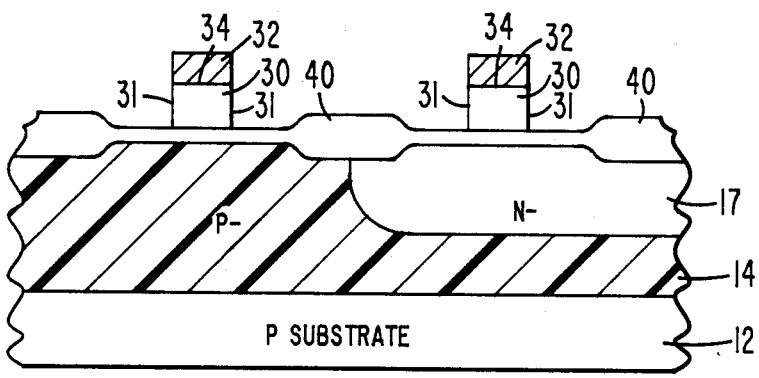

As shown in FIGS. 2 and 3, a layer 22 of undoped polysilicon or amorphous silicon is deposited over the gate oxide layer 18. The undoped polysilicon should have a thickness of from about 2000 angstroms to about 3000 amgstroms and a resistivity of from about 10,000 to about 100,000 ohms cm. A layer 24 of silicon nitride about 1500 to 3000 angstroms thick is then deposited over the layer 22 of polysilicon. The silicon nitride layer 24 and polysilicon layer 22 are then etched, utilizing well known photolithographic techniques, to form the gates 30 having sidewalls 31 suitably positioned adjacent various sites on the device 10 which will ultimately become MOS transistors. Each gate 30 includes a silicon nitride cap 32 on its top surface 34, the purpose of which will be described below.

Figure 4:
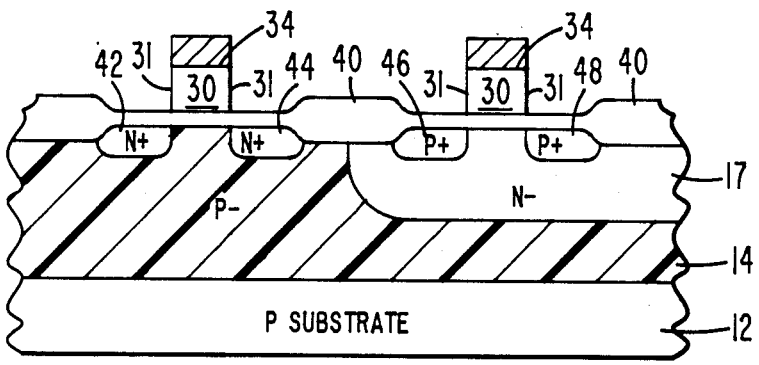
Figure 5:
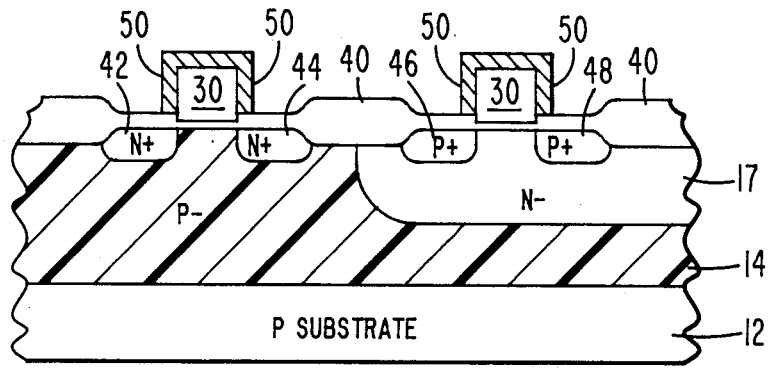

As shown in FIG. 4, source and drain regions 42 and 44 of second conductivity type, which is highly doped N type, are formed adjacent the sidewalls 31 of one of the gates 30 in a manner that is well known in the art. Similarly, source and drain regions 46 and 48 of first conductivity type, which is highly doped P type, are formed adjacent the sidewalls 31 of another of the gates 30 in a manner that is well known in the art. As the source and drain regions are implanted, a small amount of doping impurities will penetrate the silicon nitride cap 32 and lightly dope the gate 30. The silicon nitride cap 32 is then etched away and the device 10 heated in an oxygen atmosphere to grow thermal oxide 50 on the sidewalls 31 of the gates 30. This oxidation step may be performed prior to forming the source and drain regions. In either case the thickness of the oxide over the source and drain regions and the isolation regions 40 will necessarily increase, see FIG. 5.

Figure 6:
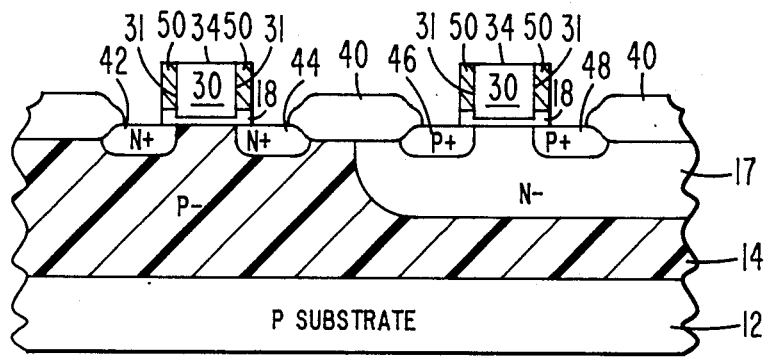

The oxide that is in physical contact with the source and drain regions 42, 44, 46, and 48 and the top surfaces 34 of the gates 30 is removed so that the silicon is exposed at these areas, as shown in FIG. 6. An anisotropic plasma etch process is used to accomplish this removal. An anisotropic plasma will etch the oxide along the direction of the electric field of the plasma. This field is arranged perpendicular to the surface 16 thereby causing the uniform removal of oxide in a plane that is parallel with that surface. Therefore, the oxide that is directly over the source and drain regions and the top surfaces 34 of the gates 30 can be removed while leaving the oxide layer 50 on the sidewalls 31 of the gates 30. It is important that no part of the sidewalls 31 be exposed, that is, the entire sidewalls 31 must be completely covered with oxide that joins the gate oxide 18. The reason for this will be explained below.

Figure 7:
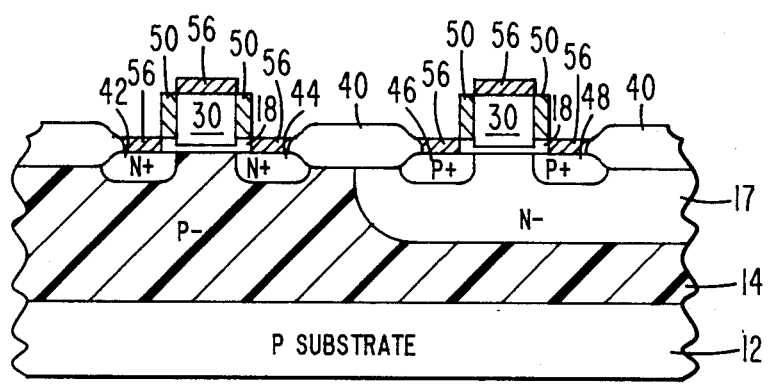

A layer 56 of refractory metal such as tungsten or molybdenum, preferably tungsten, is selectively deposited on the exposed silicon surfaces of the source and drain regions 42, 44, 46, and 48 and the top surfaces 34 of the gates 30, as shown in FIG. 7. The tungsten layer 56 may be from about 200 angstroms to about 1500 angstroms thick. This selective deposition of tungsten is achieved automatically by using the silicon reduction method which is well known in the art. When using this method tungsten will deposit onto single crystal silicon or polysilicon surfaces but not onto silicon oxide surfaces. By carefully forming the oxide layers 50 on the sidewalls 31 of the gates 30, the tungsten layer 56 will be very precisely self-aligned to the source and drain regions and the gates 30. This will assure that the tungsten layer 56 will not short together the gate 30 and one of the source and drain regions. For additional assurance, the thickness of the tungsten layer 56 should not exceed about one half of the thickness of the polysilicon or of the depth of the N+ or P+ source and drain regions 42, 44, 46, and 48.

Figure 8:
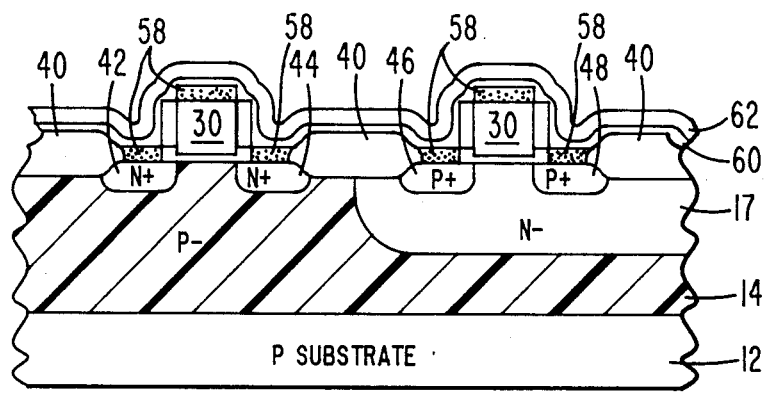

As shown in FIG. 8, a relatively thin layer 60, 500 to 1000 angstroms, of polysilicon is deposited onto the device 10. The device 10 is then heated in an oxygen atmosphere thereby sintering the tungsten layer 56 and forming a tungsten silicide layer 58 on the surface 16 at the source and drain regions 42, 44, 46, and 48, and on the top surface 34 of the gates 30. This sintering step also causes the polysilicon layer 60 to oxidize thereby growing a layer 62 of silicon oxide to an approximate thickness of about two times the thickness of the polysilicon layer 60.

Any suitable process that is well known in the art may be utilized to complete the fabrication of the device 10. This would include such steps as deposition of reflow glass, metallization to interconnect various portions of the integrated circuits, and passivation procedures.

One of the important advantages of the present invention is that the desirable structure described herein can be easily obtained with fewer processing steps than required by prior art methods, this being achieved by automatic self-aligning techniques which can be readily implemented in existing fabrication procedures.

I claim:

1. In a method of making an MOS field effect transistor of an integrated circuit in a semiconductor body, said body having a surface and a layer of gate oxide disposed on said surface, the steps comprising:
    (a) forming an undoped silicon gate on said gate oxide having a top surface and a pair of sidewalls;
    (b) forming a source region in said body adjacent one of said sidewalls and a drain region in said body adjacent the other of said side walls;
    (c) forming a layer of silicon oxide on said silicon gate including said sidewalls thereof;
    (d) removing a portion of said layer of silicon oxide leaving said silicon oxide on only said sidewalls thereby leaving an exposed silicon surface on each of said source and drain regions and said undoped silicon gate;
    (e) forming a layer of refractory metal on only said exposed surfaces;
    (f) forming a layer of polysilicon on said layer of refractory metal; and
    (g) heating said layer of refractory metal, said layer of polysilicon, and said body in an oxygen atmosphere thereby forming metal silicide at each of said exposed surfaces.

2. The method set forth in claim 1 wherein said removing a portion of said layer of silicon oxide in step (d) is accomplished by using an anisotropic etch.

3. The method set forth in claim 1 wherein step (g) includes completely oxidizing said layer of polysilicon.

4. The method set forth in claim 2 wherein said refractory metal is tungsten.

5. The method set forth in claim 3 wherein steps (a) and (b) include:
    (i) forming a layer of undoped silicon on said gate oxide having a thickness of from about 2000 angstroms to about 3000 angstroms;
    (ii) forming a layer of silicon nitride on said layer of undoped silicon;
    (iii) removing a portion of said layers of silicon nitride and undoped silicon to form an undoped silicon gate having said pair of sidewalls and a silicon nitride cap;
    (iv) forming said source and drain regions; and
    (v) removing said silicon nitride cap.

* * * * *